(12) United States Patent
Liu

(10) Patent No.: US 12,230,742 B2
(45) Date of Patent: Feb. 18, 2025

(54) SUBSTRATE AND METHOD OF MANUFACTURING THEREOF

(71) Applicant: TCL CHINA STAR OPTOELECTRONICS TECHNOLOGY CO., LTD., Shenzhen (CN)

(72) Inventor: Weiwei Liu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 1101 days.

(21) Appl. No.: 17/252,156

(22) PCT Filed: Nov. 13, 2020

(86) PCT No.: PCT/CN2020/128634
§ 371 (c)(1),
(2) Date: Dec. 14, 2020

(87) PCT Pub. No.: WO2022/052293
PCT Pub. Date: Mar. 17, 2022

(65) Prior Publication Data
US 2022/0320383 A1 Oct. 6, 2022

(30) Foreign Application Priority Data
Sep. 10, 2020 (CN) .......................... 202010945145.4

(51) Int. Cl.
*H01L 33/54* (2010.01)
*H01L 33/00* (2010.01)
*H01L 33/10* (2010.01)

(52) U.S. Cl.
CPC ............ *H01L 33/54* (2013.01); *H01L 33/005* (2013.01); *H01L 33/10* (2013.01); *H01L 2933/005* (2013.01)

(58) Field of Classification Search
CPC ....... H01L 33/10; H01L 33/005; H01L 33/54; H01L 33/0095; H01L 25/167;
(Continued)

(56) References Cited

U.S. PATENT DOCUMENTS

2019/0302917 A1 10/2019 Pan

FOREIGN PATENT DOCUMENTS

| CN | 104078550 A | 10/2014 |
| CN | 109103166 A | 12/2018 |

(Continued)

OTHER PUBLICATIONS

International Search Report in International application No. PCT/CN2020/128634, mailed on Jun. 23, 2021.
(Continued)

*Primary Examiner* — Zandra V Smith
(74) *Attorney, Agent, or Firm* — PV IP PC; Wei Te Chung

(57) ABSTRACT

A substrate and a method of manufacturing thereof. A scratch-resistant layer is formed before filling the solder paste in the area corresponding to the binding terminal of the light-emitting device on the substrate, so that each circuit in the drive circuit area of the substrate will not be damaged during screen printing. After filling solder paste, the scratch-resistant layer is stripped off to prevent the circuit on the substrate from being damaged, without affecting the performance of the substrate.

20 Claims, 6 Drawing Sheets

(58) Field of Classification Search
CPC .......... H01L 25/0753; H01L 2933/005; H01L 33/46; H01L 2933/0025; H01L 2933/0066; H01L 33/44
See application file for complete search history.

(56) References Cited

FOREIGN PATENT DOCUMENTS

| | | |
|---|---|---|
| CN | 110767795 A | 2/2020 |
| CN | 111128942 A | 5/2020 |
| CN | 111354774 A | 6/2020 |
| CN | 111554783 A | 8/2020 |
| CN | 111564453 A | 8/2020 |

OTHER PUBLICATIONS

Written Opinion of the International Search Authority in International application No. PCT/CN2020/128634, mailed on Jun. 23, 2021.
Chinese Office Action issued in corresponding Chinese Patent Application No. 202010945145.4 dated Jun. 3, 2021, pp. 1-7.

SUBSTRATE AND METHOD OF MANUFACTURING THEREOF

RELATED APPLICATIONS

This application is a Notional Phase of PCT Patent Application No. PCT/CN2020/128634 having international filing date of Nov. 13, 2020, which claims the benefit of priority of Chinese Patent Application No. 202010945145.4 filed on Sep. 10, 2020. The contents of the above applications are all incorporated by reference as if fully set forth herein in their entirety.

BACKGROUND OF INVENTION

Field of Invention

The present invention relates to a display technology, and more particularly, to a substrate and a method of manufacturing thereof.

Description of Prior Art

During a fabricating process of a mini light-emitting diode (Mini LED) substrate, it is necessary to print solder paste on Mini LED binding terminals, and then fix the Mini LED onto the solder paste. In a traditional solder paste printing process, two scrapers are disposed on opposite sides of a substrate, and then the two scrapers alternately print the entire surface of the substrate through a steel mesh. However, because scrapers exert high pressure, contact forces between the steel mesh and the substrate is relatively great during printing, which often causes a circuit on the substrate to be damaged and short-circuit, negatively affecting the functionality of the substrate.

Therefore, a technical problem associated with the Mini LED is that the circuit on the substrate of the prior art is easily damaged, which needs to be alleviated.

SUMMARY OF INVENTION

A substrate and a method of manufacturing thereof are provided, so as to solve the technical problem that the circuit in the Mini LED substrate of the prior art is easily crushed.

To solve the above problems, the technical solutions provided by the present invention are as follows:

A method of manufacturing a substrate comprises:

providing a substrate;

forming a light-emitting device binding terminal and a pixel driving circuit configured to drive a light-emitting device to emit light on one side of the substrate, wherein the light-emitting device binding terminal is disposed in a light-emitting device bonding area of the substrate, and the pixel driving circuit is disposed in a driving circuit area of the substrate;

forming a scratch-resistant layer on one side of the light-emitting device binding terminal away from the substrate, wherein the scratch-resistant layer covers the pixel driving circuit, and the scratch-resistant layer is patterned to form a first via hole, and the first via hole exposes the light-emitting device binding terminal;

filling solder paste into the first via hole by screen printing; and stripping the scratch-resistant layer, wherein the light-emitting device is bound to the light-emitting device binding terminal by solder paste.

In one embodiment, the scratch-resistant layer comprises at least one of an inorganic material, an organic composite material, an organic-inorganic composite material, and a metal material with a melting point below a threshold.

In one embodiment, the scratch-resistant layer comprises a positive photosensitive material or a negative photosensitive material.

In one embodiment, the scratch-resistant layer comprises photosensitive polyimide.

In one embodiment, step of the stripping the scratch-resistant layer comprises irradiating the scratch-resistant layer by an excimer laser used as a light source to strip off the scratch-resistant layer.

In one embodiment, step of the forming a scratch-resistant layer on one side of the light-emitting device binding terminal away from the substrate comprises forming the scratch-resistant layer having a thickness greater than 3 microns.

In one embodiment, step of forming a light-emitting device binding terminal and a pixel driving circuit configured to drive a light-emitting device to emit light on one side of the substrate comprises sequentially forming a first metal layer, a gate insulating layer, an active layer, and a second metal layer on the substrate, the first metal layer is patterned to form a gate of each transistor in the pixel driving circuit, and the second metal layer is patterned to form the light-emitting device binding terminal and a source/a drain of each transistor.

In one embodiment, before forming a scratch-resistant layer on one side of the light-emitting device binding terminal away from the substrate further comprises forming a chip binding terminal in a chip bonding area of the substrate.

In one embodiment, the light emitting device comprises mini light-emitting diode (Mini LED) or micro light-emitting diode (Micro LED).

A substrate manufactured by the above-mentioned method.

A method of manufacturing a substrate comprises:

providing a substrate;

forming a light-emitting device binding terminal and a pixel driving circuit configured to drive a light-emitting device to emit light on one side of the substrate, wherein the light-emitting device binding terminal is disposed in a light-emitting device bonding area of the substrate, and the pixel driving circuit is disposed in a driving circuit area of the substrate;

forming a reflective layer and a scratch-resistant layer on one side of the light-emitting device binding terminal away from the substrate, wherein the scratch-resistant layer covers the pixel driving circuit, and the scratch-resistant layer is patterned to form a first via hole, and the first via hole exposes the light-emitting device binding terminal;

filling solder paste into the first via hole by screen printing; and stripping the scratch-resistant layer, wherein the light-emitting device is bound to the light-emitting device binding terminal by solder paste.

In one embodiment, the scratch-resistant layer comprises at least one of an inorganic material, an organic composite material, an organic-inorganic composite material, and a metal material with a melting point below a threshold.

In one embodiment, the scratch-resistant layer comprises a positive photosensitive material or a negative photosensitive material.

In one embodiment, the scratch-resistant layer comprises photosensitive polyimide.

In one embodiment, step of the stripping the scratch-resistant layer comprises irradiating the scratch-resistant layer by an excimer laser used as a light source to strip off the scratch-resistant layer.

In one embodiment, step of forming a light-emitting device binding terminal and a pixel driving circuit configured to drive a light-emitting device to emit light on one side of the substrate comprises sequentially forming a first metal layer, a gate insulating layer, an active layer, and a second metal layer on the substrate, the first metal layer is patterned to form a gate of each transistor in the pixel driving circuit, and the second metal layer is patterned to form the light-emitting device binding terminal and a source/a drain of each transistor.

In one embodiment, before forming a scratch-resistant layer on one side of the light-emitting device binding terminal away from the substrate further comprises forming a chip binding terminal in a chip bonding area of the substrate.

In one embodiment, the light emitting device comprises mini light-emitting diode (Mini LED) or micro light-emitting diode (Micro LED).

In one embodiment, step of forming a reflective layer and a scratch-resistant layer on one side of the light-emitting device binding terminal away from the substrate and the scratch-resistant layer covering the pixel driving circuit comprises forming the scratch-resistant layer on one side of the light-emitting device binding terminal away from the substrate, and the scratch-resistant layer extends to cover the substrate.

In one embodiment, step of stripping the scratch-resistant layer comprises removing the scratch-resistant layer by dry etching.

The beneficial effects of present invention are described as follows: a substrate and a method of manufacturing a substrate are provided. The method comprises: providing a substrate; forming a light-emitting device binding terminal and a pixel driving circuit configured to drive a light-emitting device to emit light on one side of the substrate, and the light-emitting device binding terminal is disposed in a light-emitting device bonding area of the substrate, and the pixel driving circuit is disposed in a driving circuit area of the substrate; forming a scratch-resistant layer on one side of the light-emitting device binding terminal away from the substrate, and the scratch-resistant layer covers the pixel driving circuit, and the scratch-resistant layer is patterned to form a first via hole, and the first via hole exposes the light-emitting device binding terminal; filling solder paste into the first via hole by screen printing; and stripping the scratch-resistant layer, and the light-emitting device is bound to the light-emitting device binding terminal by solder paste. In the present invention, before the solder paste is filled, a scratch-resistant layer is formed, so that each circuit in the drive circuit area of the substrate will not be crushed during screen printing. After filling solder paste, the scratch-resistant layer is stripped off to prevent the circuit on the substrate from being crushed without affecting the performance of the substrate.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art substrated on drawings without any creative effort.

DETAILED DESCRIPTION OF PREFERRED EMBODIMENTS

The description of the following embodiments refers to the attached drawings to illustrate specific embodiments that can be implemented in this application. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof.

A substrate and a method of manufacturing thereof are provided, so as to alleviate the technical problem that the circuit on the mini light-emitting diode (mini LED) substrate of the prior art is easily crushed.

Figure 1:
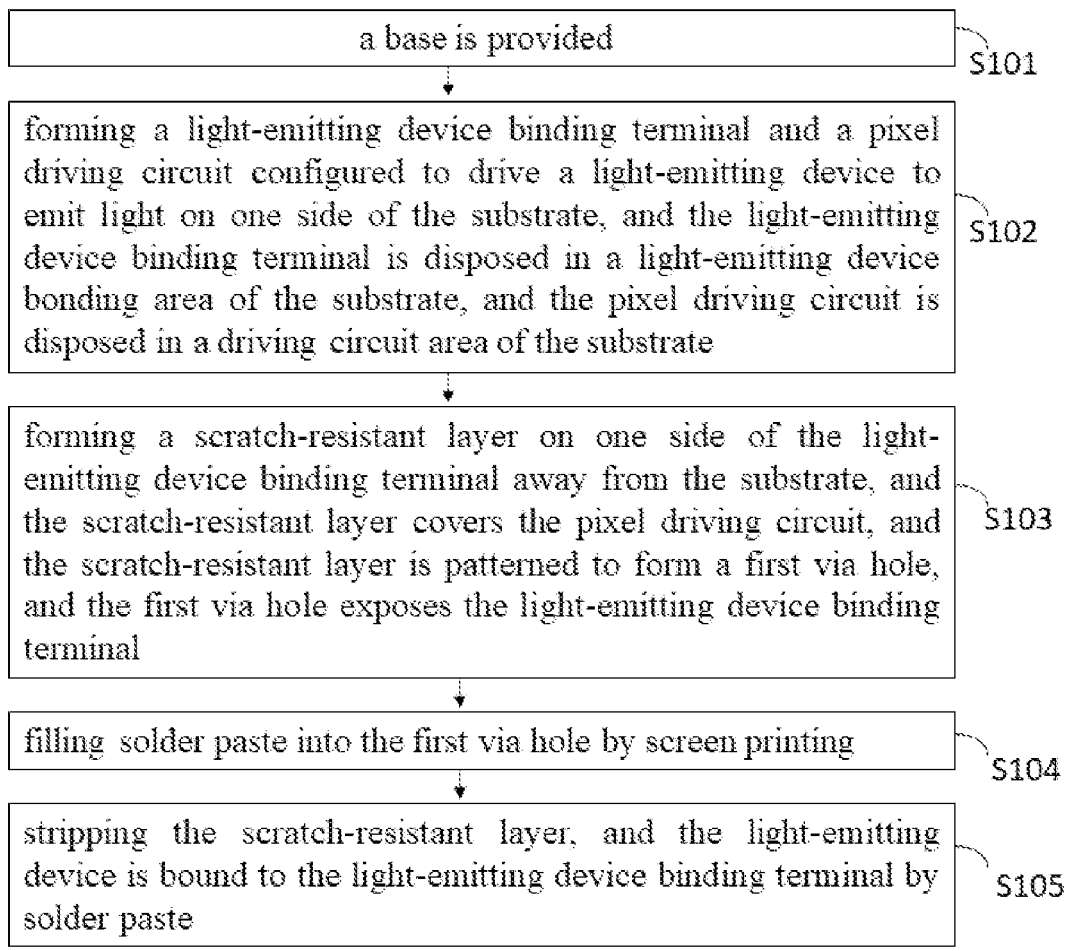
FIG. 1 is a schematic flowchart of a method of manufacturing a substrate according to one embodiment of the present invention.

Referring to FIG. 1, a method of manufacturing a substrate comprises steps as follows:

S101: providing a substrate;

S102: forming a light-emitting device binding terminal and a pixel driving circuit configured to drive a light-emitting device to emit light on one side of the substrate; the light-emitting device binding terminal is disposed in a light-emitting device bonding area of the substrate; and the pixel driving circuit is disposed in a driving circuit area of the substrate;

S103: forming a scratch-resistant layer on one side of the light-emitting device binding terminals away from the substrate; the scratch-resistant layer covers the pixel driving circuit; the scratch-resistant layer is patterned to form a first via hole; and the first via hole exposes the light-emitting device binding terminal;

S104: filling solder paste into the first via hole by screen printing; and

S105: stripping the scratch-resistant layer, and the light-emitting device is bound to the light-emitting device binding terminal by solder paste.

Figure 2:
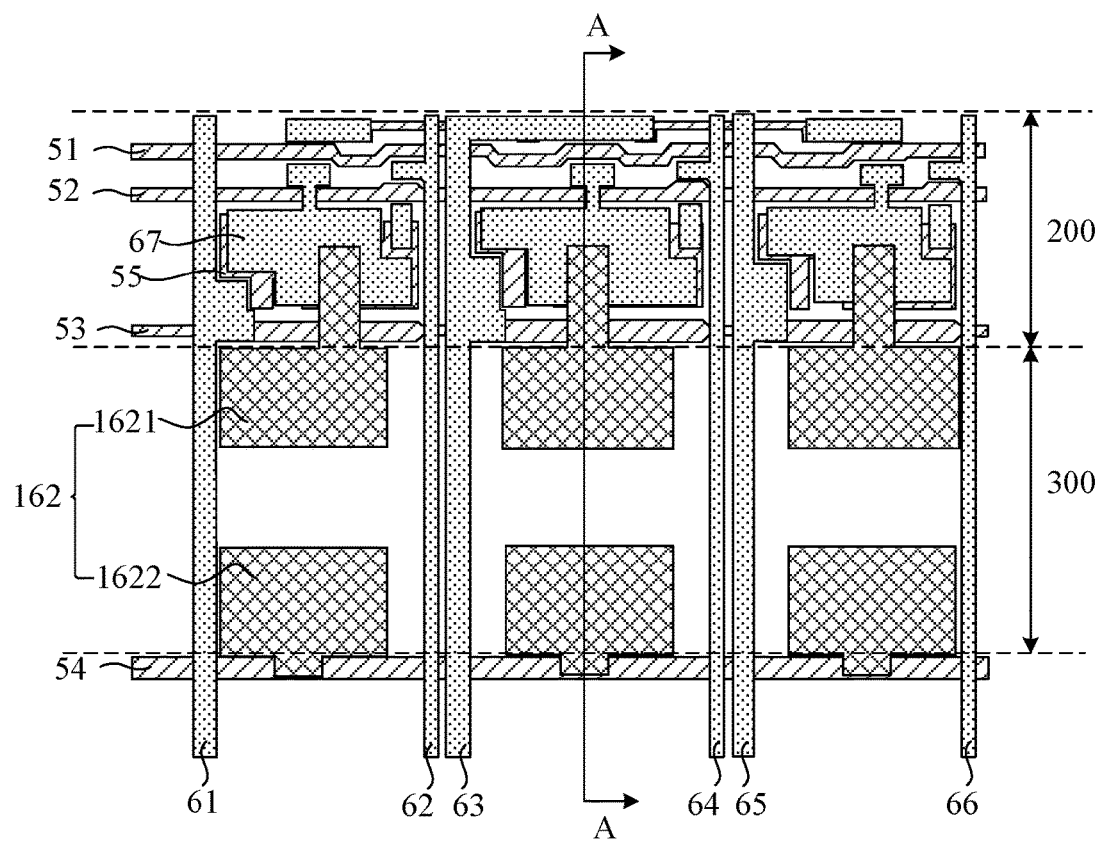
FIG. 2 is a schematic view of a planar structure of the substrate according to one embodiment of the present invention.

Referring to FIG. 2, it is a schematic view of a planar structure of a substrate according to one embodiment of the present invention. The substrate comprises a chip bonding area (not shown), a driving circuit area 200, and a light emitting bonding area 300. A plurality of light-emitting device bonding areas 300 arranged in an array are provided on the substrate, and a light-emitting device binding terminal 162 is disposed in each light-emitting device bonding area 300. The light-emitting device binding terminal 162 comprises a first binding part 1621 and a second binding part 1622. After forming the light-emitting device binding terminal 162, the first via hole between the first binding part 1621 and the second binding part 1622 is filled with solder paste through steel mesh through screen printing. Then, a light-emitting device is bound to the light-emitting device binding terminal 162 through solder paste to fix the substrate. As for each light-emitting device, a pixel driving circuit is correspondingly disposed to drive the light-emitting device to emit light. The pixel driving circuit is disposed in the driving circuit area 200, and the driving circuit area 200 is adjacent to the light-emitting device bonding area 300, and is also arranged in an array in the substrate. The chip bonding area is located at an edge area of the substrate, and a driving chip is disposed in the chip bonding area to provide electrical signals for each pixel driving circuit, so that the pixel driving circuit can work to drive the light emitting device to emit light.

The substrate includes, from bottom to top, a substrate, a first metal layer, a gate insulating layer, an active layer, and a second metal layer. FIG. 2 merely shows the first metal layer and the second metal layer. The first metal layer is patterned to form a plurality of signal lines including a first scan line 51, a second scan line 52, a third scan line 53, a fourth scan line 54, and a first plate 55 used as a storage capacitor. The second metal layer is also patterned to form a plurality of signal lines including a first data line 61, a power high-potential signal line 62, a second data line 63, a sensing line 64, a third data line 65, a power high-potential signal line 66, and a second plate 67 used as a storage capacitor. In addition, the second metal layer forms a light-emitting device binding terminal 162 in the light-emitting device bonding area 300.

In the driving circuit area 200, there are a plurality of overlapping areas in the projection of the signal lines of the first metal layer and the signal lines of the second metal layer on the substrate.

A thickness of the overlapping area is greater than thicknesses of other areas. When the solder paste is filled into the first via hole between the first binding part 1621 and the second binding part 1622 through steel mesh by screen printing, the scraper is most likely to crush the signal lines in the overlapping area.

In the present invention, a scratch-resistant layer is formed before the solder paste is filled, so that the signal lines forming the pixel drive circuit in the drive circuit area of the substrate will not be crushed during screen printing. After the solder paste is filled, the scratch-resistant layer is stripped off to prevent the circuit on the substrate from being crushed, without affecting the performance of the substrate.

The method will be described in detail below with reference to FIG. 3 to FIG. 10, FIG. 3 and FIG. 10 are schematic views of layer structure along the A-A section in FIG. 2.

Figure 3:
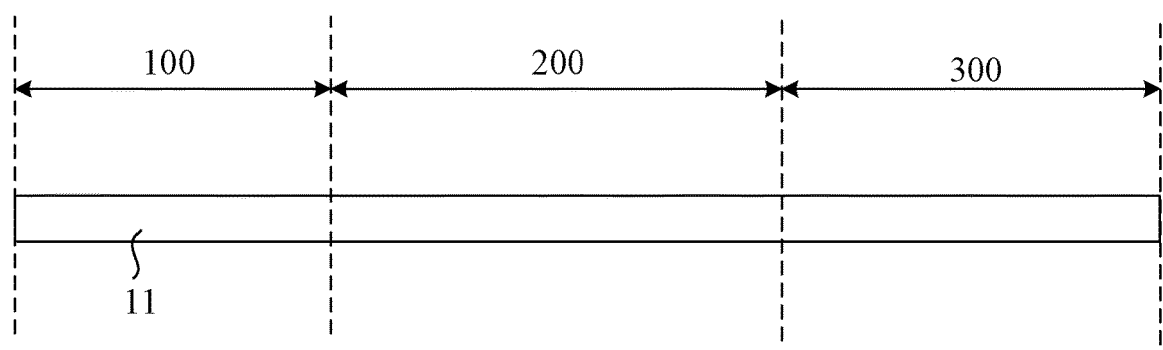
FIG. 3 is a schematic view of a first stage of a method of manufacturing a substrate according to one embodiment of the present invention.

In S101, a substrate is provided. As shown in FIG. 3 to FIG. 10, the substrate comprises a chip bonding area 100, a driving circuit area 200, and a light-emitting device bonding area 300. As shown in FIG. 3, the substrate 11 may be a flexible substrate or a rigid substrate, such as glass, etc. The material of the substrate 11 is not limited herein.

Figure 4:
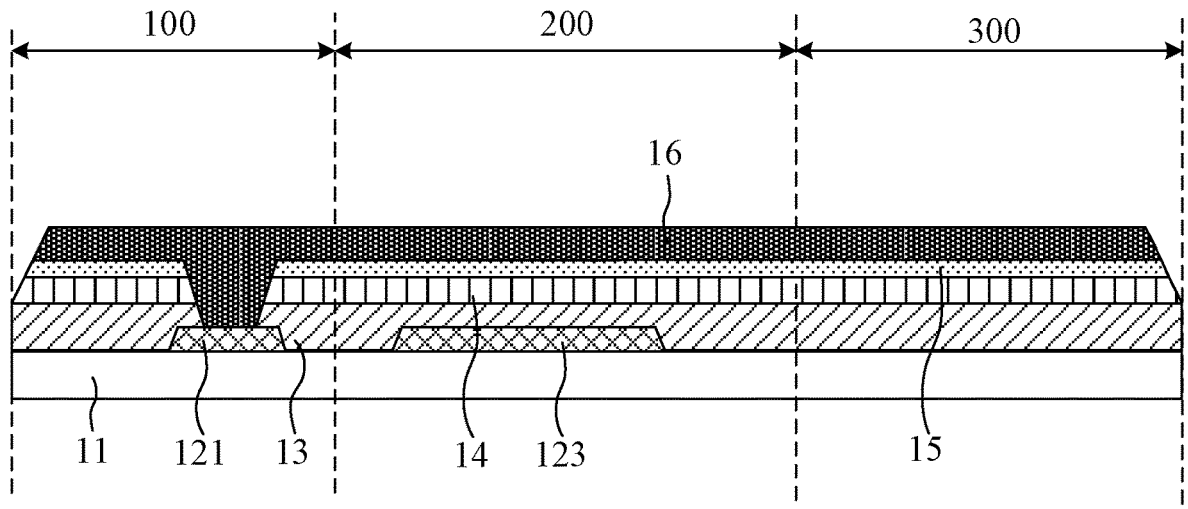
FIG. 4 is a schematic view of a second stage of the method of manufacturing the substrate according to one embodiment of the present invention.

In S102, forming a light-emitting device binding terminal and a pixel driving circuit configured to drive a light-emitting device to emit light on one side of the substrate, and the light-emitting device binding terminal is disposed in a light-emitting device bonding area of the substrate, and the pixel driving circuit is disposed in a driving circuit area of the substrate. In this embodiment, a thin film transistor with a bottom gate structure formed on the substrate in the driving circuit area 200 is taken as an example for description. As shown in FIG. 4, a first metal layer, a gate insulating layer 13, an active layer 14, an ohmic contact layer 15, and a second metal layer 16 are sequentially formed on the substrate 11.

A barrier (not shown) and a buffer layer (not shown) are usually disposed between the substrate 11 and the first metal layer. The barrier layer is generally made of silicon oxide ($SiO_x$), which is used to prevent foreign particles from entering the substrate 11 and to block out moisture. The buffer layer is generally made of silicon nitride (SiNx). Silicon nitride has a strong ion barrier property and a good moisture blocking ability, which can effectively prevent impurities from diffusing into the thin film transistor during a thermal process.

The first metal layer is formed on the substrate 11, and then is patterned to form a gate 123 of the thin film transistor in the driving circuit area 200. Also, the first metal layer is patterned to form a first conductive member 121 in the chip bonding area 100. Furthermore, the first metal layer is patterned to form a second conductive member (not shown) in the light-emitting device bonding area 300. The first conductive member 121 and the second conductive member may be various types of signal lines formed in the first metal layer. The material of the first metal layer comprises at least one of copper, molybdenum copper alloy, and molybdenum aluminum alloy.

The gate insulating layer 13 is formed on the first metal layer. Generally, a material of the gate insulating layer 13 comprises at least one of silicon nitride ($SiN_x$) and silicon oxide ($SiO_x$), and may have a single-layer or multi-layer structure.

The active layer 14 is formed on the gate insulating layer 13. The active layer 14 comprises an amorphous silicon, a polycrystalline silicon (a-Si), or a metal oxide semiconductor. The metal oxide semiconductor may comprise at least one of indium tin oxide, indium gallium zinc oxide, indium zinc tin oxide, and indium gallium zinc tin oxide.

The ohmic contact layer 15 is formed on the active layer 14, and the second metal layer 16 is formed on the ohmic contact layer 15. The material of the second metal layer 16 comprises at least one of copper, molybdenum copper alloy, and molybdenum aluminum alloy.

Figure 5:
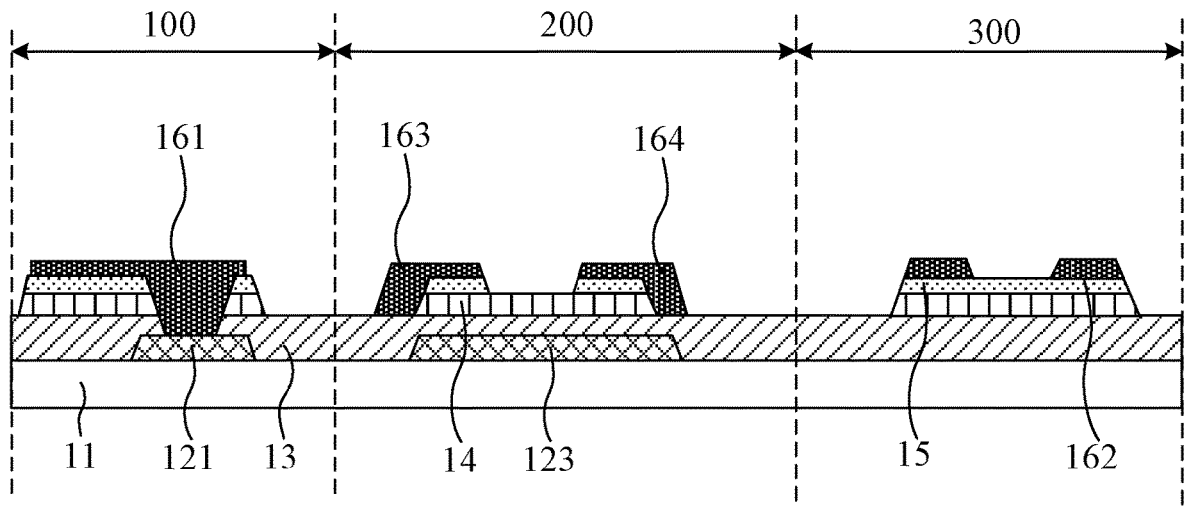
FIG. 5 is a schematic view of a third stage of the method of manufacturing the substrate according to one embodiment of the present invention.

Referring to FIG. 5, after the second metal layer 16 is formed, the active layer 14, the ohmic contact layer 15, and the second metal layer 16 are patterned.

The active layer 14 comprises three parts respectively formed in the chip bonding area 100, the driving circuit area 200, and the light-emitting device bonding area 300. The part located in the driving circuit region 200 comprises a source region, a drain region formed by doping N-type impurity ions or P-type impurity ions, and a channel region between the source region and the drain region.

The ohmic contact layer 15 comprises three parts respectively formed in the chip bonding area 100, the driving circuit area 200, and the light-emitting device bonding area 300. The part of the driving circuit area 200 is formed in the source region and the drain region of the active layer 14.

The second metal layer 16 is patterned to form a source 163 and a drain 164 of the thin film transistor in the driving circuit area 200. Also, the second metal layer 16 is patterned to form a chip binding terminal 161 in the chip bonding area 100. Furthermore, the second metal layer 16 is patterned to form a light-emitting device binding terminal 162 in the light-emitting device bonding area 300. The source 163 and the drain 164 are connected to the source region and the drain region of the active layer 14, and the chip binding terminal 161 is connected to the first conductive member 121 through a via hole.

After the above steps are finished, the chip binding terminal 161 is formed in the chip bonding area 100 of the substrate, the driving circuit is formed in the driving circuit area 200 of the substrate, and the light-emitting device bonding terminal 162 is formed in the light-emitting device bonding area 300 of the substrate.

Thin film transistors with bottom gate structure are adopted in the above embodiments, but are not limited herein, thin film transistors with top gate structure may also be adopted. In this case, the active layer 14 is formed between the substrate 11 and the first metal layer.

Figure 6:
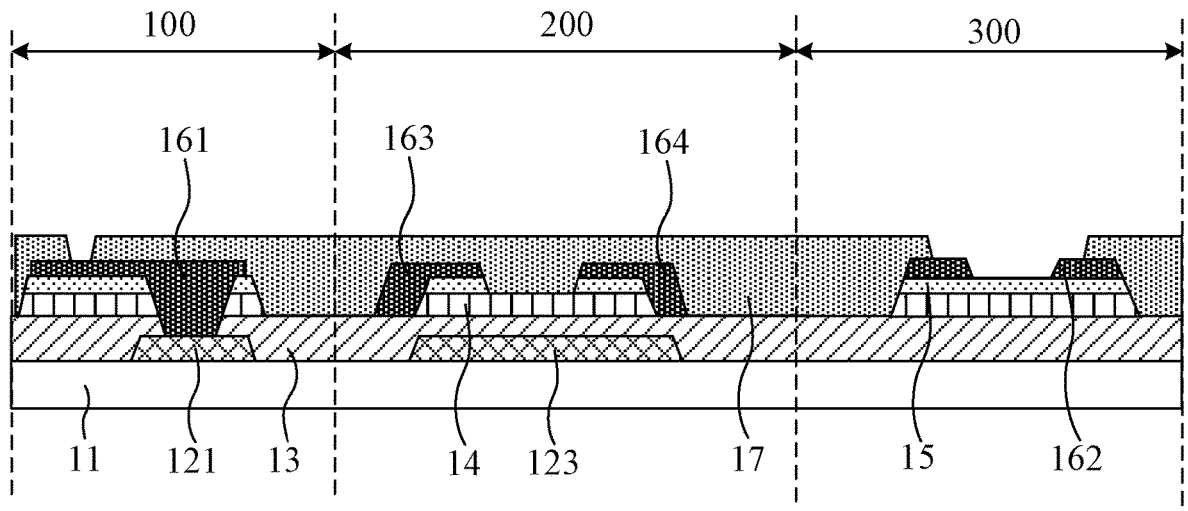
FIG. 6 is a schematic view of a fourth stage of the method of manufacturing the substrate according to one embodiment of the present invention.

Referring to FIG. 6, a passivation layer 17 is formed on an entire surface the second metal layer. The material of the passivation layer 17 comprises at least one of silicon nitride ($SiN_x$) and silicon oxide ($SiO_x$), which can be a single-layer or multilayer structure. After the passivation layer 17 is formed, via holes are formed in the chip bonding area 100 and the light-emitting device bonding area 300.

Figure 7:
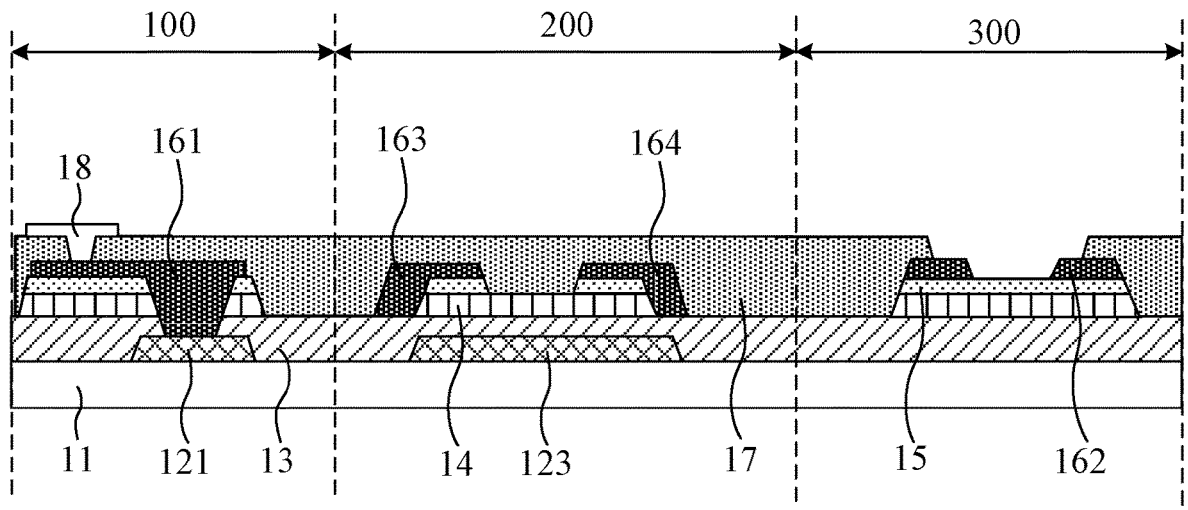
FIG. 7 is a schematic view of a fifth stage of the method of manufacturing the substrate according to one embodiment of the present invention.

Referring to FIG. 7, an electrode layer is formed on the passivation layer 17, and electrode layer is patterned to form an electrode 18. The electrode 18 is located in the chip bonding area 100 and is connected to the chip binding terminal 161 through the via hole formed in the passivation layer 17.

In S103, forming a scratch-resistant layer on one side of the light-emitting device binding terminal away from the substrate, wherein the scratch-resistant layer covers the pixel driving circuit, and the scratch-resistant layer is patterned to form a first via hole, and the first via hole exposes the light-emitting device binding terminal.

Figure 8:
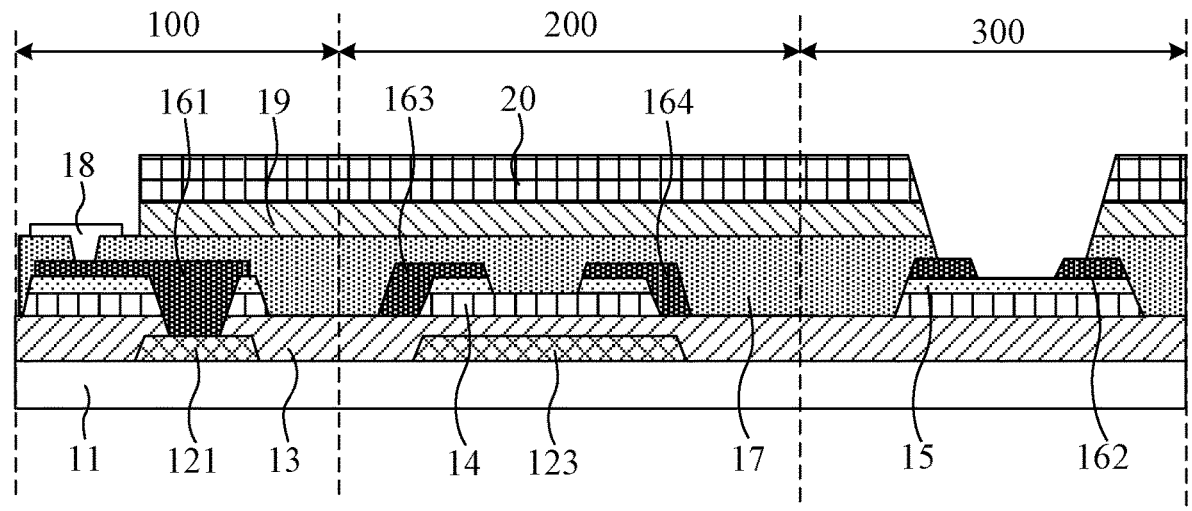
FIG. 8 is a schematic view of a sixth stage of the method of manufacturing the substrate according to one embodiment of the present invention.

Referring to FIG. 8, the scratch-resistant layer comprises at least one of an inorganic material, an organic composite material, an organic-inorganic composite material, and a metal material with a melting point below a threshold. Also, it may be a single layer formed of above-mentioned materials, or a composite film layer formed of two or more of the above-mentioned materials. The scratch-resistant layer 20 is disposed and corresponds to the driving circuit area 200 of the substrate. The pixel driving circuit is formed in the driving circuit area 200, and the pixel driving circuit comprises a plurality of overlapping signal lines formed by patterning the first metal layer and the second metal layer 16. In addition, the scratch-resistant layer 20 may also be a whole-layer structure, extending to cover an entire area where the substrate 11 is located. Only the first via hole is formed in the light-emitting device bonding area 300, and other areas are covered and protected by the scratch-resistant layer 20. A thickness of the scratch-resistant layer 20 is greater than 3 microns.

In one embodiment, the scratch-resistant layer 20 comprises a positive photosensitive material or a negative photosensitive material. When the scratch-resistant layer 20 is made of a positive photosensitive material, the part of the light-emitting device binding terminal 162 is exposed during forming the first via hole, and other parts are not exposed. When the scratch-resistant layer 20 is made of a negative photosensitive material, the part of the light-emitting device binding terminal 162 is not exposed during forming the first via hole, and other parts are exposed. Then, during development, a first via hole is formed and corresponds to the position where the light-emitting device binding terminal 162 is located.

The scratch-resistant layer 20 comprises photosensitive polyimide. When developing and removing the material in the first via hole, a variety of different developing solutions can be used for removal.

In one embodiment, at 47° C., ethanolamine, N-methylpyrrolidone, and water are mixed with a mass fraction ratio of 1:1:1 to form a developer, and the exposed scratch-resistant layer 20 is developed for 2.5 minutes to form the first via hole.

In one embodiment, at 47° C., ethanolamine, N-methylpyrrolidone, and water are mixed with a mass fraction ratio of 4:1:1 to form a developer, and the exposed scratch-resistant layer 20 is developed for 1.5 minutes to form the first via hole.

In one embodiment, a 10% concentration of tetramethylammonium hydroxide solution is used to develop the exposed scratch-resistant layer 20 for 18 minutes to form the first via hole.

In one embodiment, a reflective layer 19 is firstly formed on one side of the light-emitting device binding terminal 162 away from the substrate 11, and then the scratch-resistant layer 20 is formed. Next, the reflective layer 19 and the scratch-resistant layer 20 are patterned to form a first via hole. The first via hole is formed in the light-emitting device binding area 300 and exposes the light-emitting device binding terminal 162. When forming the first via hole, the reflective layer 19 and the scratch-resistant layer 20 are formed first, and then the first via hole is formed in the area at the same time. In addition, the first via hole in the passivation layer 17 may also be formed together with the reflective layer 19 and the scratch-resistant layer 20.

After subsequent binding with the light-emitting device, the light emitted by the light-emitting device will be emitted back after encountering other components. Because the substrate is provided with a reflective layer 19, the reflected light will be reflected back when it is cast on the reflective layer 19. Therefore, the utilization rate of light is improved. The reflective layer 19 is made of a material with high reflectivity.

In S104, filling solder paste into the first via hole by screen printing.

Figure 9:
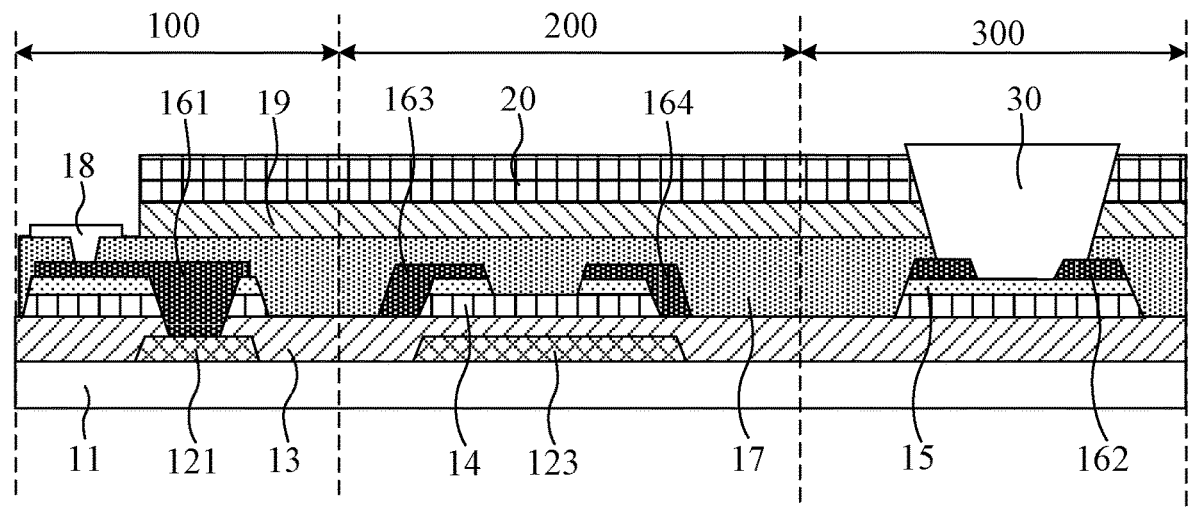
FIG. 9 is a schematic view of a seventh stage of the method of manufacturing the substrate according to one embodiment of the present invention.

Referring to FIG. 9, the first via hole is filled with a solder paste 30. When filling, a steel mesh is disposed on the substrate, the mesh of the steel mesh corresponds to the first via hole, and then two scrapers are disposed on the opposite sides of the steel mesh, and the two scrapers alternately go back and forth to the other side of the steel mesh, driving the solder paste 30 to move from one side of the substrate to the other side. When the solder paste 30 is moved to the first via hole by the scrapers, the solder paste 30 will drop from the corresponding grid on the stencil into the first via hole. Finally, the solder paste 30 will be filled into the first via hole.

In S105, stripping the scratch-resistant layer, and the light-emitting device is bound to the light-emitting device binding terminal by solder paste.

Figure 10:
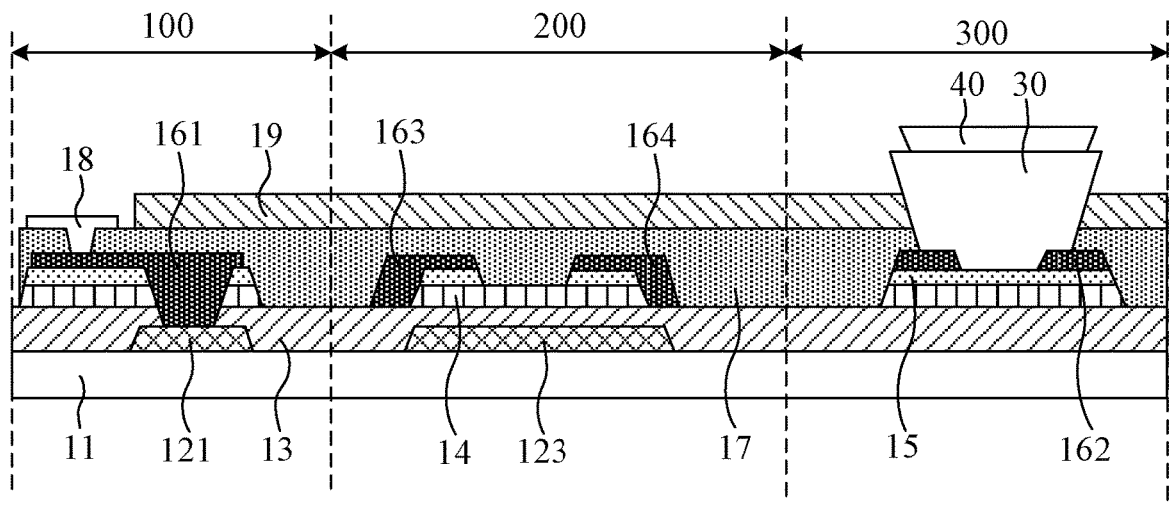
FIG. 10 is a schematic view of a eighth stage of the method of manufacturing the substrate according to one embodiment of the present invention.
Figure 11:
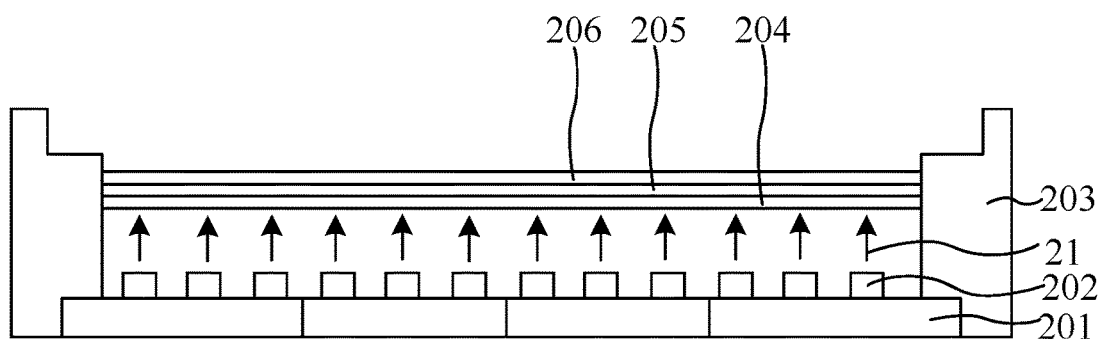
FIG. 11 is a schematic structural view of a backlight module according to one embodiment of the present invention.

Referring to FIG. 10, after the solder paste 30 is filled, the scratch-resistant layer 20 is stripped off. During stripping, an excimer laser can be used as a light source to irradiate the scratch-resistant layer 20 to strip off the scratch-resistant layer 20, or a dry etching can be used to etch and remove the scratch-resistant layer 20. The specific removal method depends on the characteristics of the material. The process of stripping off the scratch-resistant layer 20 is within the scope of the present application.

When the excimer laser is used to separate the scratch-resistant layer 20, the laser energy attenuates less in other layers of the substrate because the excimer laser has a high energy density. When the laser reaches the junction between the scratch-resistant layer 20 and the reflective layer 19, it is absorbed by the scratch-resistant layer 20, which causes the temperature of the scratch-resistant layer 20 to rise, and the scratch-resistant layer 20 is thermally decomposed, so that the scratch-resistant layer 20 is stripped off from other layers of the substrate. In addition, due to the high reflectivity of the reflective layer 19, the laser is reflected by the reflective layer 19, thereby further enhancing stripping effect and increasing product reliability. Taking the scratch-resistant layer 20 as polyimide as an example. When the excimer laser is used as the light source to irradiate the scratch-resistant layer 20, an excimer laser with a wavelength of 308 nm can be used as the light source, and the energy density threshold of the excimer laser is 160 mj/cm$^2$, which can ensure that the scratch-resistant layer 20 can be completely stripped off from other layers, and it will not cause damage to other layers due to excessive energy.

After the scratch-resistant layer 20 is removed, the light-emitting device 40 is bound to the light-emitting device binding terminal 162 through the solder paste 30. The light-emitting device comprises a mini LED or a micro LED device. After the bonding is finished, the substrate is temporarily stored for a period of time, and then other processes such as reflow soldering are performed to complete the fabrication of the substrate.

In the method of manufacturing the substrate, before the solder paste is filled, a scratch-resistant layer is formed to perform protection, so that each circuit in the drive circuit area of the substrate will not be crushed during screen printing. After the solder paste is filled, the scratch-resistant layer is stripped off, so that the reflective layer is exposed without affecting the reflectivity of the substrate, thus achieving scratch-resistant and reduction of reflectivity.

Furthermore, a substrate is provided. It is made by any one of the above-mentioned embodiments. By forming a scratch-resistant layer before filling the solder paste, the signal lines forming the pixel drive circuit in the drive circuit area of the substrate will not be crushed during screen printing. After filling the solder paste, the scratch-resistant layer is stripped off to prevent the circuit on the substrate from being crushed without affecting the performance of the substrate.

Referring to FIG. 10, a backlight module is also provided and comprises a substrate 201, a light-emitting device 202, a plastic frame 203, a diffuser plate 204, a reflective plate 205, and an optical film 206. The light-emitting device 202 is bound to the substrate 201, and the substrate 201 is manufactured by any of the above-mentioned manufacturing methods. The light-emitting device 202 is a mini LED or micro LED device, which is used as a backlight source in the backlight module.

After subsequent assembly with the liquid crystal display panel, the liquid crystal display panel is fixed on the plastic frame 203 of the backlight module through an adhesive layer. The light 21 emitted by the light-emitting device 202 disposed on the substrate 201 in the backlight module is irradiated on the liquid crystal display panel after passing through the diffuser 204 plate, the reflective plate 205, and the optical film 206. The light 21 passes through the lower polarizer of the liquid crystal display panel to become polarized light. The liquid crystal panel uses the thin film transistor (TFT) switch function to input different data signal voltages to each pixel. The liquid crystal molecules rotate in different states under different voltages. The degree of transmission of polarized light is also different, and the brightness of the light finally emitted through the upper polarizer is also different, so as to achieve multi-gray-scale screen display.

In a small-sized backlight module, only one substrate 201 is disposed, and in a medium-large-sized backlight module, a plurality of substrates 201 are used for assembling.

For example, in an 8K product with a resolution of 7680×4320, a subarea on a liquid crystal display panel usually includes a plurality of pixels. The backlight module is formed by assembling twelve substrates 201. All the light-emitting devices 202 form a plurality of backlight units. Each substrate 201 comprises four hundred thirty-two backlight units. Each backlight unit comprises four light-emitting diode (LED) devices connected in series. The drive circuit in each substrate 201 drives the light-emitting device 202 in the substrate individually, controls the light emission individually, and provides backlighting for the pixels in each subarea. Compared with the backlight module driven by the entire surface, the brightness control of the backlight module driven by the subarea is more flexible, and the luminous effect is better.

In the backlight module, before the solder paste is filled, a scratch-resistant layer is formed, so that each circuit in the drive circuit area of the substrate will not be crushed during screen printing. After filling solder paste, the scratch-resistant layer is stripped off to prevent the circuit on the substrate from being crushed without affecting the performance of the substrate.

In the present invention, not only the substrate is applied to a backlight module, but also is directly applied to a display panel to form a mini LED display panel or a Micro LED display panel. In this case, the light-emitting device is used as each sub-pixel in the display panel. Accordingly, the present invention also provides a display panel, including the substrate described in any of the above embodiments. In the present invention, before the solder paste is filled, a scratch-resistant layer is formed, so that each circuit in the drive circuit area of the substrate will not be crushed during screen printing. After filling solder paste, the scratch-resistant layer is stripped off to prevent the circuit on the substrate from being crushed without affecting the performance of the substrate.

According to the above embodiments, a substrate and a method of manufacturing a substrate are provided. The method comprises: providing a substrate; forming a light-emitting device binding terminal and a pixel driving circuit configured to drive a light-emitting device to emit light on one side of the substrate, and the light-emitting device binding terminal is disposed in a light-emitting device bonding area of the substrate, and the pixel driving circuit is disposed in a driving circuit area of the substrate; forming a scratch-resistant layer on one side of the light-emitting device binding terminal away from the substrate, and the scratch-resistant layer covers the pixel driving circuit, and the scratch-resistant layer is patterned to form a first via hole, and the first via hole exposes the light-emitting device binding terminal; filling solder paste into the first via hole by screen printing; and stripping the scratch-resistant layer, and the light-emitting device is bound to the light-emitting device binding terminal by solder paste. In the present invention, before the solder paste is filled, a scratch-resistant layer is formed, so that each circuit in the drive circuit area of the substrate will not be crushed during screen printing. After filling solder paste, the scratch-resistant layer is stripped off to prevent the circuit on the substrate from being crushed without affecting the performance of the substrate.

In the above-mentioned embodiments, the description of each embodiment has its own focus. For parts that are not described in detail in an embodiment, reference may be made to related descriptions of other embodiments.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing a substrate, comprising:
    providing a substrate;
    forming a light-emitting device binding terminal and a pixel driving circuit configured to drive a light-emitting device to emit light on one side of the substrate, wherein the light-emitting device binding terminal is disposed in a light-emitting device bonding area of the substrate, and the pixel driving circuit is disposed in a driving circuit area of the substrate;
    forming a scratch-resistant layer on one side of the light-emitting device binding terminal away from the substrate, wherein the scratch-resistant layer covers the pixel driving circuit, and the scratch-resistant layer is patterned to form a first via hole, and the first via hole exposes the light-emitting device binding terminal;
    filling solder paste into the first via hole by screen printing; and
    stripping the scratch-resistant layer, wherein the light-emitting device is bound to the light-emitting device binding terminal by solder paste.

2. The method of manufacturing the substrate according to claim 1, wherein the scratch-resistant layer comprises at least one of an inorganic material, an organic composite material, an organic-inorganic composite material, and a metal material with a melting point below a threshold.

3. The method of manufacturing the substrate according to claim 2, wherein the scratch-resistant layer comprises a positive photosensitive material or a negative photosensitive material.

4. The method of manufacturing the substrate according to claim 3, wherein the scratch-resistant layer comprises photosensitive polyimide.

5. The method of manufacturing the substrate according to claim 1, wherein a step of stripping the scratch-resistant layer comprises irradiating the scratch-resistant layer by an excimer laser used as a light source to strip off the scratch-resistant layer.

6. The method of manufacturing the substrate according to claim 1, wherein a step of the forming a scratch-resistant layer on one side of the light-emitting device binding terminal away from the substrate comprises forming the scratch-resistant layer having a thickness greater than 3 microns.

7. The method of manufacturing the substrate according to claim 1, wherein a step of forming a light-emitting device binding terminal and a pixel driving circuit configured to drive a light-emitting device to emit light on one side of the substrate comprises sequentially forming a first metal layer, a gate insulating layer, an active layer, and a second metal layer on the substrate; the first metal layer is patterned to form a gate of each transistor in the pixel driving circuit; and the second metal layer is patterned to form the light-emitting device binding terminal and a source/a drain of each transistor.

8. The method of manufacturing the substrate according to claim 1, wherein before forming a scratch-resistant layer on one side of the light-emitting device binding terminal away from the substrate further comprises forming a chip binding terminal in a chip bonding area of the substrate.

9. The method of manufacturing the substrate according to claim 1, wherein the light emitting device comprises mini light-emitting diode (Mini LED) or micro light-emitting diode (Micro LED).

10. A substrate manufactured by the method of claim 1.

11. A method of manufacturing a substrate, comprising:
    providing a substrate;
    forming a light-emitting device binding terminal and a pixel driving circuit configured to drive a light-emitting device to emit light on one side of the substrate, wherein the light-emitting device binding terminal is disposed in a light-emitting device bonding area of the substrate, and the pixel driving circuit is disposed in a driving circuit area of the substrate;
    forming a reflective layer and a scratch-resistant layer on one side of the light-emitting device binding terminal away from the substrate, wherein the scratch-resistant layer covers the pixel driving circuit, and the scratch-resistant layer is patterned to form a first via hole, and the first via hole exposes the light-emitting device binding terminal;
    filling solder paste into the first via hole by screen printing; and
    stripping the scratch-resistant layer, wherein the light-emitting device is bound to the light-emitting device binding terminal by solder paste.

12. The method of manufacturing the substrate according to claim 11, wherein the scratch-resistant layer comprises at least one of an inorganic material, an organic composite material, an organic-inorganic composite material, and a metal material with a melting point below a threshold.

13. The method of manufacturing the substrate according to claim 12, wherein the scratch-resistant layer comprises a positive photosensitive material or a negative photosensitive material.

14. The method of manufacturing the substrate according to claim 13, wherein the scratch-resistant layer comprises photosensitive polyimide.

15. The method of manufacturing the substrate according to claim 11, wherein step of the stripping the scratch-resistant layer comprises irradiating the scratch-resistant layer by an excimer laser used as a light source to strip off the scratch-resistant layer.

16. The method of manufacturing the substrate according to claim 11, wherein a step of forming a light-emitting device binding terminal and a pixel driving circuit configured to drive a light-emitting device to emit light on one side of the substrate comprises sequentially forming a first metal layer, a gate insulating layer, an active layer, and a second metal layer on the substrate; the first metal layer is patterned to form a gate of each transistor in the pixel driving circuit; and the second metal layer is patterned to form the light-emitting device binding terminal and a source/a drain of each transistor.

17. The method of manufacturing the substrate according to claim 11, wherein before forming a scratch-resistant layer on one side of the light-emitting device binding terminal away from the substrate further comprises forming a chip binding terminal in a chip bonding area of the substrate.

18. The method of manufacturing the substrate according to claim 11, wherein the light emitting device comprises mini light-emitting diode (mini LED) or micro light-emitting diode (micro LED).

19. The method of manufacturing the substrate according to claim 11, wherein a step of forming a reflective layer and a scratch-resistant layer on one side of the light-emitting device binding terminal away from the substrate; the scratch-resistant layer covering the pixel driving circuit comprises forming the scratch-resistant layer on one side of the light-emitting device binding terminal away from the substrate; and the scratch-resistant layer extends to cover the substrate.

20. The method of manufacturing the substrate according to claim 11, wherein a step of stripping the scratch-resistant layer comprises removing the scratch-resistant layer by dry etching.

\* \* \* \* \*